United States Patent
Kondo et al.

(10) Patent No.: US 10,231,323 B2
(45) Date of Patent: Mar. 12, 2019

(54) PRINTED CIRCUIT BODY

(71) Applicant: Yazaki Corporation, Tokyo (JP)

(72) Inventors: Hiroki Kondo, Shizuoka (JP); Makoto Kambe, Shizuoka (JP); Shota Sato, Shizuoka (JP); Yukito Aoyama, Shizuoka (JP); Hisashi Takemoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/470,014

(22) Filed: Mar. 27, 2017

(65) Prior Publication Data

US 2017/0318663 A1 Nov. 2, 2017

(30) Foreign Application Priority Data

Apr. 27, 2016 (JP) ................. 2016-089539

(51) Int. Cl.
*H05K 1/02* (2006.01)
*H05K 1/05* (2006.01)
(Continued)

(52) U.S. Cl.
CPC ......... *H05K 1/0213* (2013.01); *H05K 1/0263* (2013.01); *H05K 1/05* (2013.01);
(Continued)

(58) Field of Classification Search
CPC ........ H05K 1/0213; H05K 1/092; H05K 1/18; H02G 5/00; H02G 5/005; H02G 5/007
See application file for complete search history.

(56) References Cited

U.S. PATENT DOCUMENTS 4,008,365 A * 2/1977 Carlson .................. H02G 5/007
174/68.2
4,436,953 A * 3/1984 Gottlieb ................. H02G 5/005
174/72 B
(Continued)

FOREIGN PATENT DOCUMENTS

JP H09-259950 A 10/1997
JP 2011-65749 A 3/2011
(Continued)

OTHER PUBLICATIONS

German Office Action for the related German Patent Application No. 10 2017 206 911.2 dated Feb. 26, 2018.
(Continued)

*Primary Examiner* — Hoa C Nguyen
(74) *Attorney, Agent, or Firm* — Kenealy Vaidya LLP

(57) ABSTRACT

A printed circuit body includes a bus bar as a metal member electrically connected with a connected body, an insulator layer providing insulation properties, and a conductor layer formed across the metal member and the insulator layer and electrically connected with the metal member. The metal member and the insulator layer are positioned such that a metal-member side connected surface of the metal member on which the conductor layer is provided and an insulator-layer side connected surface of the insulator layer on which the conductor layer is provided are positioned at an identical plane. This configuration allows connection between the bus bar and the conductor layer and circuit formation to be simultaneously achieved at manufacturing of the printed circuit body, thereby facilitating formation of a wiring structure of the bus bar and the conductor layer.

15 Claims, 9 Drawing Sheets

(51) Int. Cl.
   *H05K 1/09*     (2006.01)
   *H05K 1/18*     (2006.01)
   *H05K 3/22*     (2006.01)

(52) U.S. Cl.
   CPC ............... *H05K 1/092* (2013.01); *H05K 1/18* (2013.01); *H05K 3/22* (2013.01); *H05K 2201/09845* (2013.01); *H05K 2201/1034* (2013.01); *H05K 2201/10272* (2013.01); *H05K 2201/10416* (2013.01)

(56) References Cited

U.S. PATENT DOCUMENTS

| | | | | |
|---|---|---|---|---|
| 5,945,637 | A | * | 8/1999 | Katsumata ............ H01R 43/205 174/267 |
| 6,172,308 | B1 | | 1/2001 | Katsumata et al. |
| 6,538,878 | B1 | * | 3/2003 | Acker .................. H01L 25/115 174/117 F |
| 2003/0137813 | A1 | * | 7/2003 | Onizuka .............. H05K 1/0263 361/777 |
| 2014/0370343 | A1 | | 12/2014 | Nomoto et al. |
| 2015/0318626 | A1 | | 11/2015 | Nakayama et al. |
| 2017/0110705 | A1 | | 4/2017 | Tosaya et al. |
| 2018/0006441 | A1 | * | 1/2018 | Sumida .................... H02G 3/16 |

FOREIGN PATENT DOCUMENTS

| | | |
|---|---|---|
| JP | 2013-058642 A | 3/2013 |
| JP | 2014-086246 A | 5/2014 |
| JP | 2016-024933 A | 2/2016 |

OTHER PUBLICATIONS

Japanese Office Action for the related Japanese Patent Application No. 2016-089539 dated Apr. 24, 2018.

* cited by examiner

BUS BAR ARRANGEMENT DIRECTION

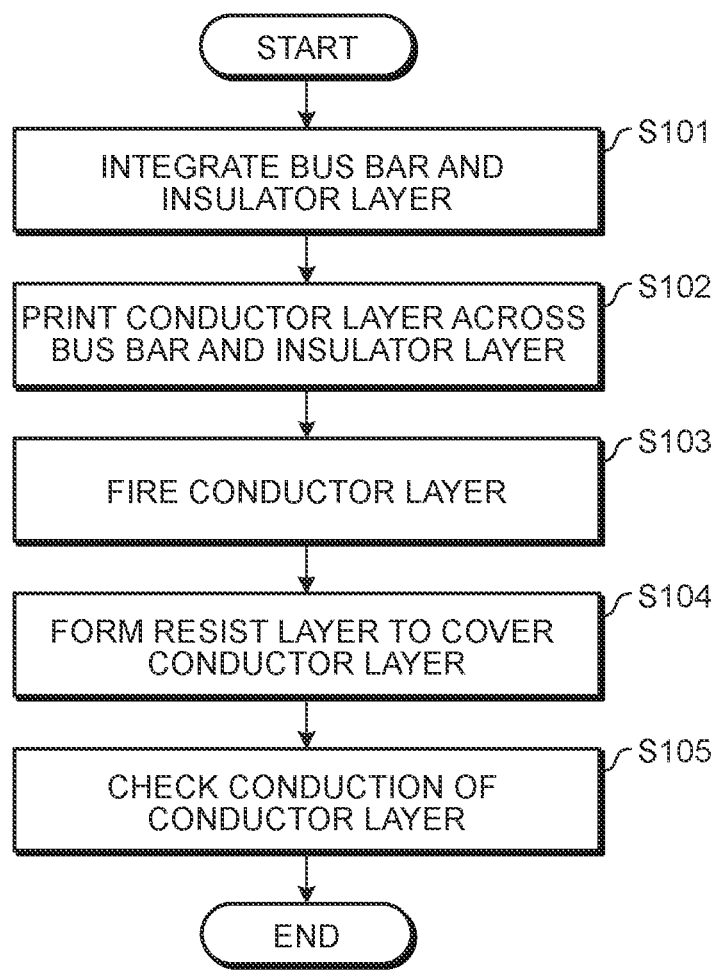

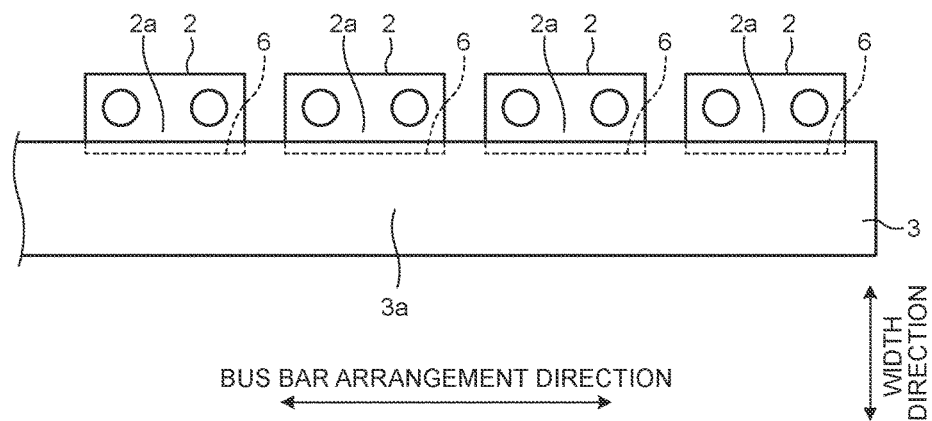
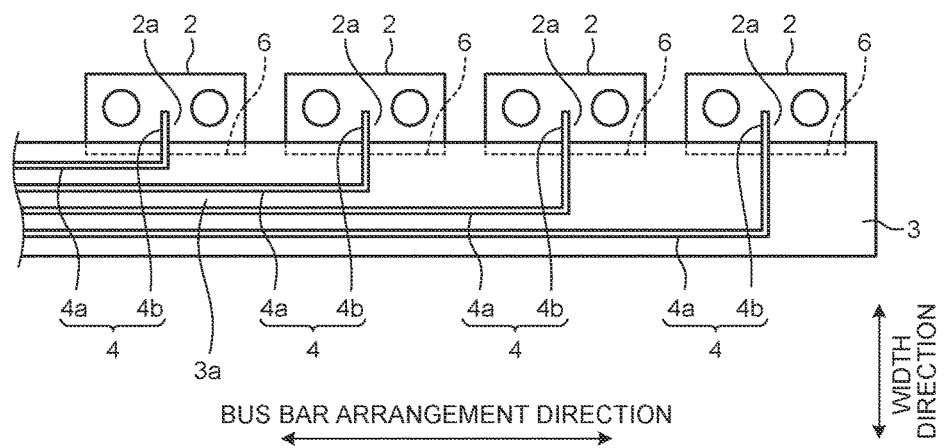

PRINTED CIRCUIT BODY

CROSS-REFERENCE TO RELATED APPLICATION (S)

The present application claims priority to and incorporates by reference the entire contents of Japanese Patent Application No. 2016-089539 filed in Japan on Apr. 27, 2016.

BACKGROUND OF THE INVENTION

1. Field of the Invention

The present invention relates to a printed circuit body.

2. Description of the Related Art

A conventionally known bus bar module (battery collection attachment) has been used in a power supply device including a plurality of secondary batteries connected in series, as a collection of bus bars used to connect the batteries in series (refer to Japanese Patent Application Laid-open No. 2011-65749, for example). Each bus bar of the bus bar module is connected with an electrical line as a voltage detection line. This voltage detection line can be used to output voltage information on a battery coupled with each bus bar to a peripheral instrument (for example, an ECU of a vehicle), thereby achieving, for example, charging control of a power supply device.

In the conventional bus bar module disclosed in Japanese Patent Application Laid-open No. 2011-65749, however, the voltage detection line needs to be wired to each bus bar, for example, at assembly to a power supply device, which leaves room for improvement in workability at assembly and manufacturing. In a structure such as the bus bar module as described above, in other words, a structure including a metal member (bus bar) electrically connected with a connected body (battery), and a conductor layer (voltage detection line) electrically connected with the connected body through the metal member, it has been desired to easily form a wiring structure in which the metal member and the conductor layer are connected with each other.

SUMMARY OF THE INVENTION

The present invention is made in view of the above-described circumstances and an object of the present invention is to provide a printed circuit body in which a wiring structure of a metal member electrically connected with a connection connected body and a conductor layer can be easily formed.

In order to achieve the above mentioned object, a printed circuit body according to one aspect of the present invention includes a metal member electrically connected with a connected body; an insulator layer providing insulation; and a conductor layer formed across the metal member and the insulator layer and electrically connected with the metal member, wherein a metal-member side connected surface of the metal member on which the conductor layer is provided and an insulator-layer side connected surface of the insulator layer on which the conductor layer is provided are positioned at an identical plane.

According to another aspect of the present invention, the printed circuit body may further include a second insulator layer on which the metal member and the insulator layer are placed separately from each other, wherein the conductor layer may be formed across the metal member, the second insulator layer, and the insulator layer, and the metal-member side connected surface, the insulator-layer side connected surface, and a second insulator-layer side connected surface of the second insulator layer on which the conductor layer is provided may be positioned at an identical plane.

According to still another aspect of the present invention, in the printed circuit body, one of the metal member and the insulator layer may include a recess formed in a depth equivalent to a thickness of the other, and the metal-member side connected surface and the insulator-layer side connected surface may be positioned at an identical plane with an end part of the other being housed in the recess.

According to still another aspect of the present invention, in the printed circuit body, the second insulator layer may include a first recess formed in a depth equivalent to a thickness of the metal member and a second recess formed in a depth equivalent to a thickness of the insulator layer, and the metal-member side connected surface, the insulator-layer side connected surface, and the second insulator-layer side connected surface are positioned at an identical plane with an end part of the metal member being housed in the first recess and an end part of the insulator layer being housed in the second recess.

According to still another aspect of the present invention, the printed circuit body may further include a protection layer covering and protecting the conductor layer.

According to still another aspect of the present invention, in the printed circuit body, the conductor layer may be a printed body formed by printing.

According to still another aspect of the present invention, in the printed circuit body, the conductor layer may be the printed body formed by printing conductive paste and then performing firing to provide conduction, and the conductive paste may be any one of Ag paste, Cu paste, and Au paste, metal primary components of which are silver (Ag), copper (Cu), and gold (Au), respectively, or a mixture of two or more of these pastes.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a flowchart illustrating a process of manufacturing the printed circuit body according to the first embodiment;

FIG. 6 is a schematic diagram for description of processing in step S101 in the flowchart illustrated in FIG. 5;

FIG. 7 is a schematic diagram for description of processing in step S102 in the flowchart illustrated in FIG. 5;

DETAILED DESCRIPTION OF THE PREFERRED EMBODIMENTS

Embodiments of a printed circuit body according to the present invention will be described below with reference to the accompanying drawings. In the following drawings, any identical or equivalent parts are denoted by identical reference numbers, and any duplicate description thereof will be omitted.

First Embodiment

Figure 1:
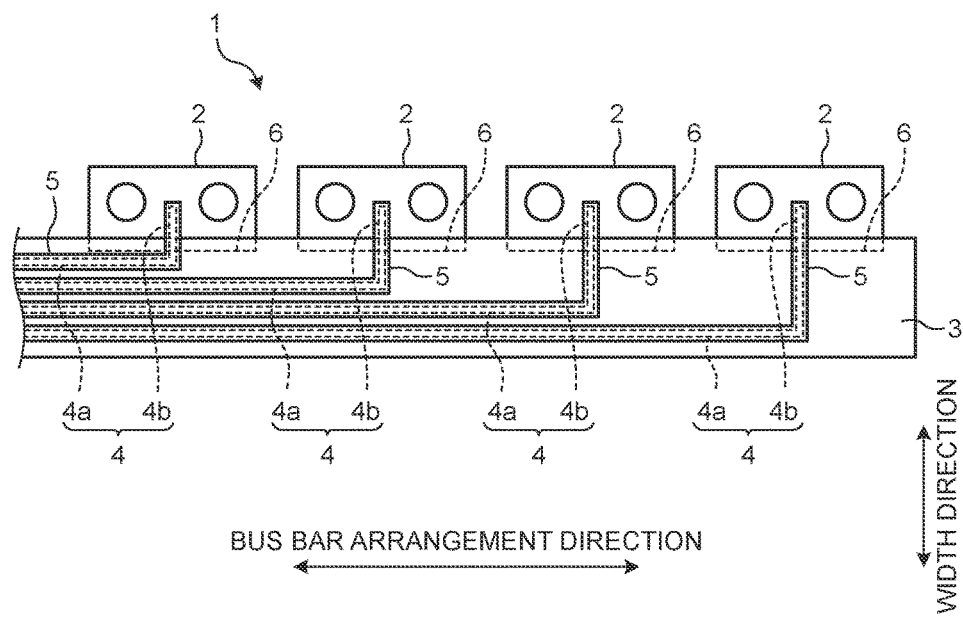
FIG. 1 is a plan view illustrating a schematic configuration of a printed circuit body according to a first embodiment of the present invention, and a schematic diagram for description of processing in step S104 in a flowchart illustrated in FIG. 5.
Figure 2:
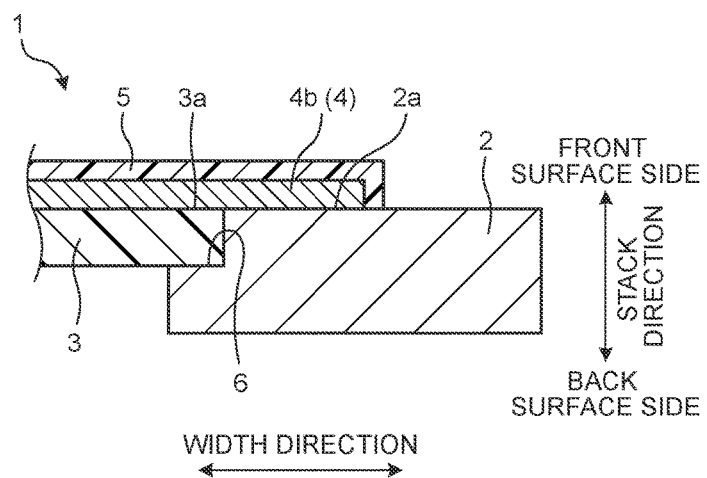
FIG. 2 is a cross-sectional view illustrating a sectional shape of the printed circuit body illustrated in FIG. 1, which is orthogonal to a bus bar arrangement direction.
Figure 3:
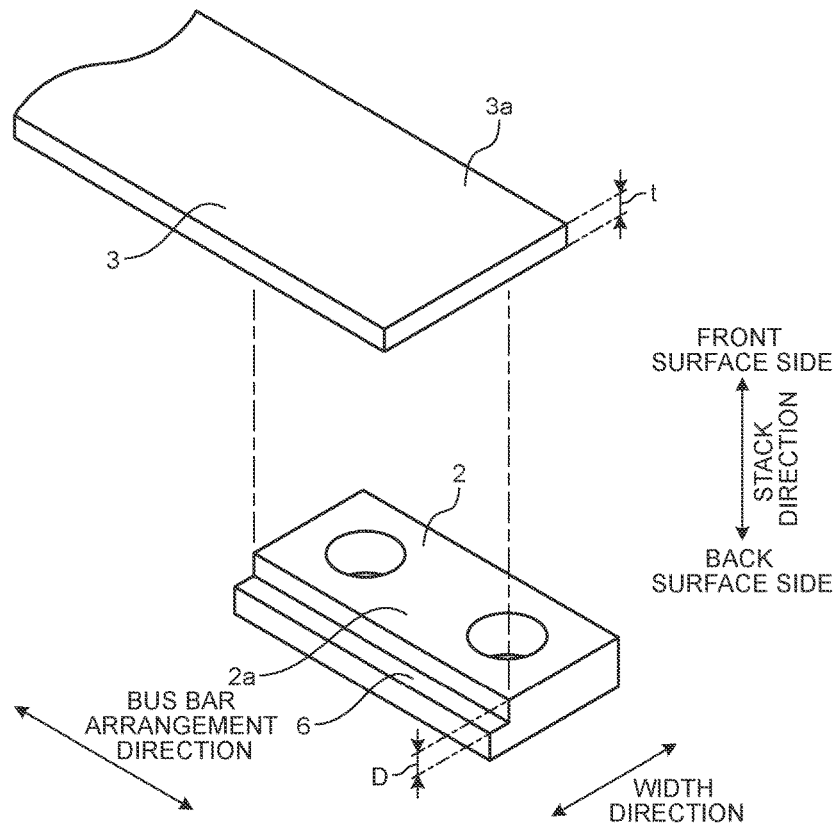
FIG. 3 is a partially exploded perspective view of the printed circuit body illustrated in FIG. 1.
Figure 4:
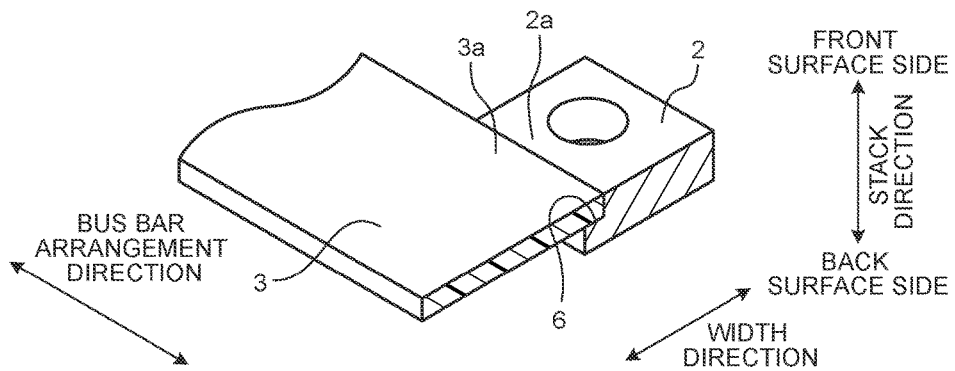
FIG. 4 is a partially sectional perspective view of the printed circuit body illustrated in FIG. 1.

The following describes a first embodiment with reference to FIGS. 1 to 7. The configuration of a printed circuit body 1 according to the first embodiment will be first described with reference to FIGS. 1 to 4. FIG. 1 is a plan view illustrating a schematic configuration of the printed circuit body according to the first embodiment of the present invention. FIG. 2 is a cross-sectional view illustrating a sectional shape of the printed circuit body illustrated in FIG. 1, which is orthogonal to a bus bar arrangement direction. FIG. 3 is a partially exploded perspective view of the printed circuit body illustrated in FIG. 1. FIG. 4 is a partially sectional perspective view of the printed circuit body illustrated in FIG. 1.

In the following description, the "bus bar arrangement direction" refers to a direction (the horizontal direction in FIG. 1) in which bus bars 2 illustrated in FIG. 1 are arranged in parallel to each other, and a "width direction" refers to a direction (the vertical direction in FIG. 1) in which short sides of an insulator layer 3 extend. In addition, a "stack direction" refers to a direction (the vertical direction in FIG. 2) in which components illustrated in FIG. 2 are stacked, a "front surface side" refers to a side on which resist layers 5 are disposed, and a "back surface side" refers to a side on which the bus bars 2 and the insulator layer 3 are disposed.

The printed circuit body 1 according to the first embodiment illustrated in FIGS. 1 to 4 includes a metal member (each bus bar 2 according to the present embodiment) electrically connected with a connected body (battery not illustrated in the present embodiment), and a conductor layer 4 electrically connected with the connected body through the metal member, and can be defined to be a structure in which the metal member and the conductor layer 4 are electrically connected with each other and integrally formed.

In the present embodiment, the configuration of the printed circuit body 1 having such a characteristic when employed as a power supply device bus bar module will be described. The power supply device bus bar module is used for a power supply device including a plurality of secondary batteries connected in series or parallel. Such a power supply device is mounted on, for example, an electric vehicle or a hybrid vehicle, and used to supply power to an electric motor or to be charged from the electric motor. For example, the power supply device includes a plurality of batteries connected in series to obtain a high battery output corresponding to output required for a vehicle. The power supply device bus bar module includes a plurality of bus bars 2. Each bus bar 2 electrically connects terminals of two adjacent batteries in the power supply device, typically, a positive electrode terminal and a negative electrode terminal. Accordingly, the power supply device bus bar module is configured to achieve serial or parallel connection of a plurality of secondary batteries of the power supply device.

In addition, the power supply device bus bar module is provided with a plurality of conductor layers 4 as voltage detection lines for outputting voltage information on a battery coupled with each bus bar 2. The number of conductor layers 4 is same as the number of bus bars 2, and each conductor layer 4 is connected with any one of the bus bars 2. The power supply device bus bar module outputs the voltage information on batteries coupled with the respective bus bars 2 to a peripheral instrument (for example, an ECU of the vehicle) through the respective conductor layers 4. The peripheral instrument can be used for, for example, charging control of each battery of the power supply device on the basis of the acquired voltage information.

As illustrated in FIGS. 1 to 4, the printed circuit body 1 includes the bus bar 2 (metal member), the insulator layer 3, the conductor layer 4, and the resist layer 5 (protection layer).

The bus bar 2 is a metal member electrically connected with the connected body (for example, a terminal of a battery). The bus bar 2 is formed in a rectangular plate shape. The printed circuit body 1 preferably includes a plurality of bus bars 2, and in the example illustrated in FIG. 1, the single printed circuit body 1 is provided with four bus bars 2. In the case of the plurality of the bas bars, the bus bars 2 are arranged in parallel to each other at a predetermined interval in one predetermined direction. In the example illustrated in FIG. 1, the four bus bars 2 are arranged in parallel to each other in the bus bar arrangement direction.

The insulator layer 3 is a substrate provided with the conductor layer 4 disposed on a surface thereof to be coupled with the bus bar 2. The insulator layer 3 is disposed so that a principal surface thereof is aligned with a principal surface of the bus bar 2. The insulator layer 3 is a strip member extending in the bus bar arrangement direction.

The insulator layer 3 provides insulation, and can use, for example, a film or molded product formed by injection molding with polyvinyl chloride (PVC). Examples of the material of the insulator layer 3 include polypropylene (PP), polyethylene terephthalate (PET), polyethylene naphthalate (PEN), polycarbonate (PC), polybutylene terephthalate (PBT), and polyimide (PI).

The bus bars 2 and the insulator layer 3 are integrated with each other through one end of each bus bar 2 in the width direction at one end face of the insulator layer 3 in the bus bar arrangement direction. In the printed circuit body 1 according to the present embodiment, the bus bar 2 and the insulator layer 3 are integrated flush with each other so that a bus bar side connected surface 2a (metal-member side connected surface) of the bus bar 2 on which the conductor layer 4 is provided and an insulator-layer side connected surface 3a of the insulator layer 3 on which the conductor layer 4 is provided are positioned at an identical plane.

More specifically, one of the bus bar 2 and the insulator layer 3 includes a recess 6 formed in a depth equivalent to a thickness of the other. In the printed circuit body 1 according to the present embodiment, the bus bar 2 includes the recess 6.

The recess 6 is formed at an end part of each bus bar 2, facing the insulator layer 3 in the width direction, in this example, an end part in the bus bar arrangement direction. The recess 6 is formed to extend from one end part of the bus bar 2 to the other end part in the bus bar arrangement direction. In other words, the recess 6 is formed to penetrate through the bus bar 2 in the bus bar arrangement direction. The recess 6 is formed as a substantially rectangular parallelepiped space having a substantially rectangular sectional shape orthogonal to the bus bar arrangement direction. The recess 6 is formed so that a depth D (refer to FIG. 3) in the stack direction is equivalent to a thickness t (refer to FIG. 3) of the insulator layer 3 in the stack direction.

The bus-bar side connected surface 2a and the insulator-layer side connected surface 3a are positioned at an identical plane with an end part of the other of the bus bar 2 and the insulator layer 3 being housed in the recess 6 (refer to FIG. 4, for example). In other words, in the printed circuit body 1 according to the present embodiment, the bus-bar side connected surface 2a and the insulator-layer side connected surface 3a are positioned at an identical plane with part of an end part of the insulator layer 3 in the bus bar arrangement direction being housed in the recess 6 formed in each bus bar 2. In the printed circuit body 1, the bus bar 2 and the insulator layer 3 are integrated with each other at a contact part, whereas part of the end part of the insulator layer 3 in the bus bar arrangement direction is housed in the recess 6 formed in each bus bar 2. Each bus bar 2 and the insulator layer 3 may be integrated with each other by various well-known methods including thermal welding. For example, each bus bar 2 and the insulator layer 3 may be integrated with each other through, for example, an adhesive, or may be integrated with each other through fastening by, for example, a screw.

The conductor layer 4 is a conductive component that is electrically connected with the bus bar 2 and thus electrically connected with the connected body connected with the bus bar 2. The conductor layer 4 is formed across the bus bar 2 and the insulator layer 3, and specifically, is formed on the bus-bar side connected surface 2a of the bus bar 2 and the insulator-layer side connected surface 3a of the insulator layer 3 on the front surface side in the stack direction as illustrated in FIG. 2. In other words, the conductor layer 4 is formed across the bus-bar side connected surface 2a of each of the bus bars 2 provided flush with each other at an identical plane and the insulator-layer side connected surface 3a of the insulator layer 3. The printed circuit body 1 includes the conductor layers 4 in the same number as the number of bus bars 2, and includes four conductor layers 4 in the example illustrated in FIG. 1. When a plurality of conductor layers 4 is provided, each conductor layer 4 is individually connected with any one of the bus bars 2. Each conductor layer 4 is formed in a linear shape, and includes a main line part 4a extending on the insulator layer 3 in the bus bar arrangement direction, and a connection line part 4b extending from the main line part 4a to the bus bar 2 in the width direction substantially orthogonal to a direction in which the main line part 4a extends. The connection line part 4b of the conductor layer 4 is formed across the bus bar 2 and the insulator layer 3 through a connection part between the bus bar 2, which is connected with the conductor layer 4, and the insulator layer 3. The conductor layer 4 is a printed body formed by printing. The conductor layer 4 has one end part thereof connected with any one of the bus bars 2 and the other end part exposed at one end part of the insulator layer 3.

The conductor layer 4 can be a printed body formed by printing, for example, conductive paste and then firing the conductive paste to provide conduction. The conductive paste may be paste obtained by adding, for example, organic solvent, reducing agent, or additive to metal particles, and the metal particles are preferably particles of silver, copper, gold, or a hybrid type as a mixture of two or more of these elements. In other words, the conductive paste is preferably any one of Ag paste, Cu paste, and Au paste the metal primary components of which are silver (Ag), copper (Cu), and gold (Au), respectively, or a mixture of two or more of these pastes.

The conductor layer 4 is suitably printed by a printing technology such as screen printing, dispenser printing, ink jet printing, gravure printing, or flexographic printing. The screen or dispenser printing is preferable because a circuit width can be excellently maintained. The conductor layer 4 is preferably formed by repeating printing a plurality of times. Alternatively, the conductor layer 4 may be partially formed by repeating printing a plurality of times.

The resist layer 5 is a protection layer covering and protecting the conductor layer 4. As illustrated in FIG. 2, the resist layer 5 is formed on the front surface side of the conductor layer 4 in the stack direction. The printed circuit body 1 includes the resist layers 5 in the same number as the number of bus bars 2 and the number of conductor layers 4, and includes four resist layers 5 in the example illustrated in FIG. 1. Each resist layer 5 is formed to cover the entire range of any one of the conductor layers 4. The resist layer 5 is a thermosetting or UV curing resist. In particular, it is preferable that the resist layer 5 is an epoxy or urethane resist.

The following describes a process of manufacturing the printed circuit body 1 according to the first embodiment with reference to FIGS. 5 to 7. FIG. 5 is a flowchart illustrating the process of manufacturing the printed circuit body according to the first embodiment. FIG. 6 is a schematic diagram for description of processing in step S101 in the flowchart illustrated in FIG. 5. FIG. 7 is a schematic diagram for description of processing in step S102 in the flowchart illustrated in FIG. 5. FIG. 1 described above is a schematic diagram for description of processing in step S104 in the flowchart illustrated in FIG. 5, and thus is referred to in the following. The following describes the process of manufacturing the printed circuit body 1 in accordance with the flowchart illustrated in FIG. 5 with reference to FIGS. 1, 2, 3, 4, 6, and 7.

In step S101, each bus bar 2 and the insulator layer 3 are integrated with each other. In this example, a plurality (four, in FIG. 6) of bus bars 2 are arranged in parallel to each other in the bus bar arrangement direction, and the bus bar 2 and the insulator layer 3 are integrated by, for example, thermal welding so that the bus-bar side connected surface 2a and the insulator-layer side connected surface 3a are positioned at an identical plane in a positional relation in which part of an end part of the insulator layer 3 is housed in the recess 6 formed in each bus bar 2. As illustrated in FIG. 6, when the bus bar 2 and the insulator layer 3 are integrated, the insulator layer 3 has a strip shape extending in the bus bar arrangement direction, and part of each bus bar 2 is integrated with one end face of the insulator layer 3 in the bus bar arrangement direction. In this process, the bus bar 2 and the insulator layer 3 may be integrated with each other by bonding through an adhesive agent or by fastening through, for example, a screw. Having completed the processing in step S101, the process proceeds to step S102.

In step S102, the conductor layer 4 is formed across the bus-bar side connected surface 2a of the bus bar 2 and the insulator-layer side connected surface 3a of the insulator layer 3 by printing. The conductor layers 4 of the same number (four, in FIG. 7) as the number of bus bars 2 are formed. Each conductor layer 4 is individually connected with any one of the bus bars 2. As illustrated in FIG. 7, in each conductor layer 4, the main line part 4a is formed in a linear shape extending on the insulator layer 3 in the bus bar arrangement direction, and the connection line part 4b is formed in a linear shape extending from the main line part 4a to any one of the bus bars 2 in the width direction substantially orthogonal to a direction where the main line part 4a extends. In this process, conductive paste (Ag paste CA-6178 manufactured by DAIKEN CHEMICAL CO., LTD) is printed by using, for example, a screen printer (DP-320 manufactured by NEWLONG SEIMITSU KOGYO CO., LTD.) to dispose the conductor layer 4, in an overlapping manner, on the bus-bar side connected surface 2a of the bus bar 2 and the insulator-layer side connected surface 3a of the insulator layer 3 on the front surface side in the stack direction. Having completed the processing in step S102, the process proceeds to step S103.

In step S103, the conductor layer 4 is fired. This firing processing provides conduction to the conductor layer 4. In this process, a heated-air dryer is used to perform drying, for example, at 150° C. for 30 minutes. Having completed the processing in step S103, the process proceeds to step S104.

In step S104, the resist layer 5 is formed to cover the conductor layer 4. The same number (four, in the present embodiment) of the resist layers 5 as the number of bus bars 2 and the number of conductor layers 4 are formed. Each resist layer 5 is formed on the front surface side of any one of the conductor layers 4 in the stack direction to cover the entire range of the conductor layer 4. In other words, as illustrated in FIG. 1, each resist layer 5 is formed in a linear shape extending in the bus bar arrangement direction to cover the main line part 4a of the conductor layer 4 and is formed in a linear shape extending in the width direction to cover the connection line part 4b of the conductor layer 4. Having completed the processing in step S104, the process proceeds to step S105.

In step S105, conduction evaluation is performed to check conduction of the conductor layer 4. In the conduction evaluation, a conduction test using a tester is performed on the conductor layer 4 to check conduction between one end part of the conductor layer 4, which is closer to the bus bar 2, and the other end part closer to the insulator layer 3. Upon completion of processing in step S105, the process of manufacturing the printed circuit body 1 ends.

The following describes advantageous effects of the printed circuit body 1 according to the first embodiment.

The printed circuit body 1 according to the first embodiment includes the bus bar 2 electrically connected with a connected body such as a terminal of a battery, the insulator layer 3 providing insulation, and the conductor layer 4 formed across the bus bar 2 and the insulator layer 3 and electrically connected with the bus bar 2, and the bus-bar side connected surface 2a of the bus bar 2, on which the conductor layer 4 is provided, and the insulator-layer side connected surface 3a of the insulator layer 3, on which the conductor layer 4 is provided, are positioned at an identical plane.

In the printed circuit body 1 with this configuration, the conductor layer 4 is integrally formed in a shape across the bus bar 2 and the insulator layer 3, eliminating the necessity to perform wiring work for electrically connecting the bus bar 2 and the conductor layer 4, which is required for, for example, a conventional bus bar module. This configuration allows connection between the bus bar 2 and the conductor layer 4 and circuit formation to be simultaneously achieved at manufacturing of the printed circuit body 1, thereby facilitating formation of a wiring structure of the bus bar 2 and the conductor layer 4. In this case, in the printed circuit body 1, the bus-bar side connected surface 2a of the bus bar 2 and the insulator-layer side connected surface 3a of the insulator layer 3, on which the conductor layer 4 is provided, are positioned flush with each other at an identical plane, which allows the conductor layer 4 to be easily and accurately provided across the bus-bar side connected surface 2a and the insulator-layer side connected surface 3a. In the printed circuit body 1, the bus-bar side connected surface 2a and the insulator-layer side connected surface 3a are positioned flush with each other at an identical plane, which makes it easy to achieve a uniform thickness of the conductor layer 4 over the bus-bar side connected surface 2a and the insulator-layer side connected surface 3a. Accordingly, for example, a substantially uniform thickness of the conductor layer 4 can provide a stable conductor resistance. When applied to a power supply device bus bar module as in the present embodiment, the printed circuit body 1 can achieve, for example, reduction in the height of the device.

In the printed circuit body 1 according to the first embodiment, one of the bus bar 2 and the insulator layer 3 includes the recess 6 formed in a depth D equivalent to a thickness t of the other, and an end part of the other is housed in the recess 6, thereby the bus-bar side connected surface 2a and the insulator-layer side connected surface 3a are positioned at an identical plane. In this example, the recess 6 is formed in the bus bar 2. With this simple configuration, the printed circuit body 1 can fix relative positions of the bus bar 2 and the insulator layer 3, and achieve the configuration in which the bus-bar side connected surface 2a and the insulator-layer side connected surface 3a, on which the conductor layer 4 is provided, are positioned at an identical plane.

The printed circuit body 1 according to the first embodiment includes the resist layer 5 covering and protecting the conductor layer 4. In the printed circuit body 1 with this configuration, the conductor layer 4 is not externally exposed but protected by the resist layer 5, and thus conduction of the conductor layer 4 can be excellently maintained.

In the printed circuit body 1 according to the first embodiment, the conductor layer 4 is a printed body formed by printing. This configuration allows the printed circuit body 1 to easily achieve formation of the conductor layer 4 in a desired shape and arrangement. In this case, in the printed circuit body 1, the bus-bar side connected surface 2a of the bus bar 2 and the insulator-layer side connected surface 3a of the insulator layer 3, on which the conductor layer 4 is provided, are positioned flush with each other at an identical plane, which makes it easy to accurately print the conductor layer 4 as a printed body across the bus-bar side connected surface 2a and the insulator-layer side connected surface 3a and to substantially uniformly print the thickness of the conductor layer 4 over the bus-bar side connected surface 2a and the insulator-layer side connected surface 3a, thereby easily achieving a stable conductor resistance.

In the printed circuit body 1 according to the first embodiment, the conductor layer 4 is a printed body formed by printing conductive paste and then firing the conductive paste to provide conduction. The conductive paste is any one of Ag paste, Cu paste, and Au paste the metal primary components of which are silver (Ag), copper (Cu), and gold (Au), respectively, or a mixture of two or more of these pastes. In the printed circuit body 1 with this configuration, the conductor layer 4 can have further improved conductivity.

In the printed circuit body 1 according to the first embodiment, the insulator layer 3 is formed of any one of polyvinyl chloride (PVC), polypropylene (PP), polyethylene terephthalate (PET), polyethylene naphthalate (PEN), polycarbonate (PC), polybutylene terephthalate (PBT), polyimide (PI), and polyethylene (PE). In the printed circuit body 1 with this configuration, the insulator layer 3 can provide further improved insulation.

When the bus-bar side connected surface 2a and the insulator-layer side connected surface 3a are positioned at an identical plane as described above, manufacturing error or the like is allowed, and typically, the positioning at an identical plane only needs to allow the conductor layer 4 as a printed body to be appropriately printed across the bus-bar side connected surface 2a and the insulator-layer side connected surface 3a.

Figure 8:
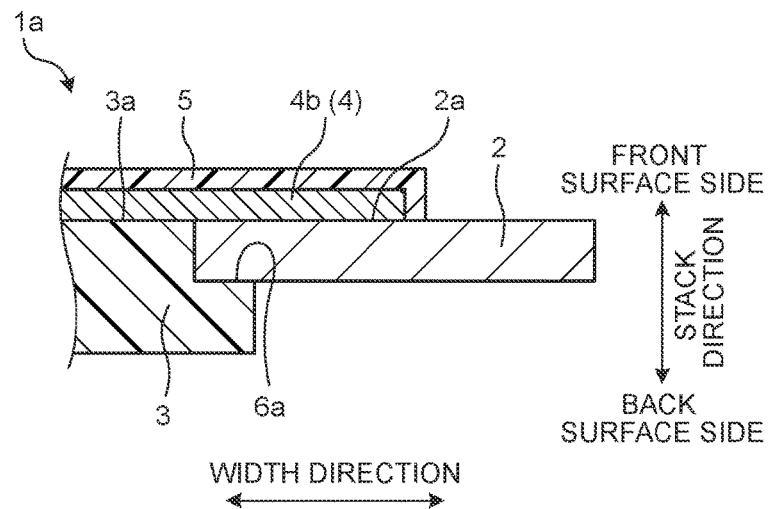
FIG. 8 is a cross-sectional view illustrating a sectional shape of a printed circuit body according to a modification, which is orthogonal to the bus bar arrangement direction.
Figure 9:
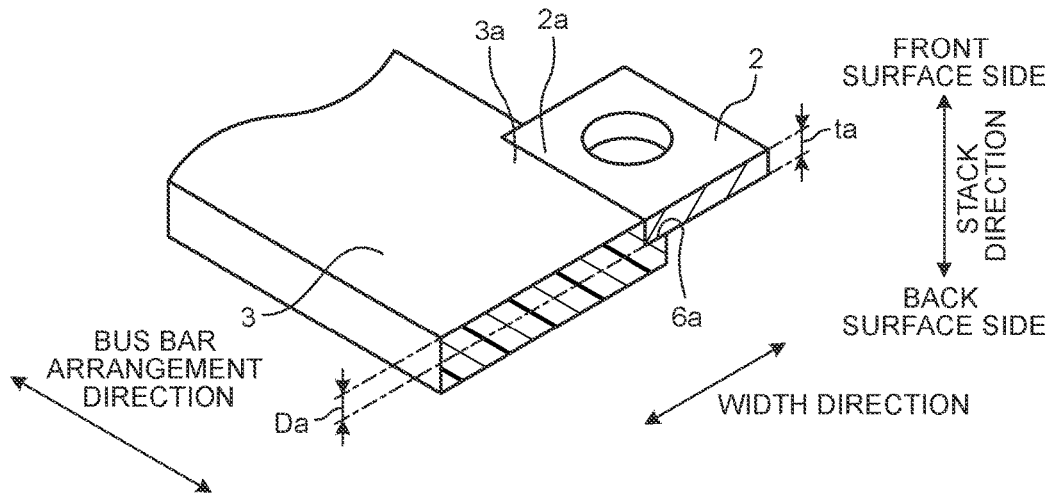
FIG. 9 is a partially sectional perspective view of the printed circuit body illustrated in FIG. 8.

The recess 6 is provided to the bus bar 2 in the above description, but it is not limited thereto, and the recess 6 may be provided to the insulator layer 3 as in a modification illustrated in FIGS. 8 and 9.

FIG. 8 is a cross-sectional view illustrating a sectional shape of a printed circuit body according to the modification, which is orthogonal to the bus bar arrangement direction. FIG. 9 is a partially sectional perspective view of the printed circuit body illustrated in FIG. 8. In a printed circuit body 1a according to the modification illustrated in FIGS. 8 and 9, the insulator layer 3 includes a recess 6a. The recess 6a is formed at an end part of the insulator layer 3, facing each bus bar 2 in the width direction, or in this example, at an end part in the bus bar arrangement direction. The recess 6a is formed to extend in a range of the insulator layer 3, in which the bus bar 2 is provided in the bus bar arrangement direction. The recess 6a is formed as a substantially rectangular parallelepiped space having a substantially rectangular sectional shape orthogonal to the bus bar arrangement direction. The recess 6a is formed so that a depth Da (refer to FIG. 9) in the stack direction is equivalent to a thickness to (refer to FIG. 9) of the bus bar 2 in the stack direction. A plurality of, four in this case, recesses 6a corresponding to the number of bus bars 2 are provided. In the printed circuit body 1a according to the present modification, the bus-bar side connected surface 2a and the insulator-layer side connected surface 3a are positioned at an identical plane with an end part of the bus bar 2 in the bus bar arrangement direction being housed in the recess 6a formed in the insulator layer 3. Even in this case, the printed circuit body 1a can fix relative positions of the bus bar 2 and the insulator layer 3 with this simple configuration, and achieve the configuration in which the bus-bar side connected surface 2a and the insulator-layer side connected surface 3a, on which the conductor layer 4 is provided, are positioned at an identical plane.

The printed circuit bodies 1 and 1a may each have a configuration in which recesses are provided in both of the bus bar 2 and the insulator layer 3, and relative positions of the bus bar 2 and the insulator layer 3 are fixed through integration in a positional relation in which these recesses are engaged with each other, so that the bus-bar side connected surface 2a and the insulator-layer side connected surface 3a, on which the conductor layer 4 is provided, are positioned at an identical plane.

Second Embodiment

Figure 10:
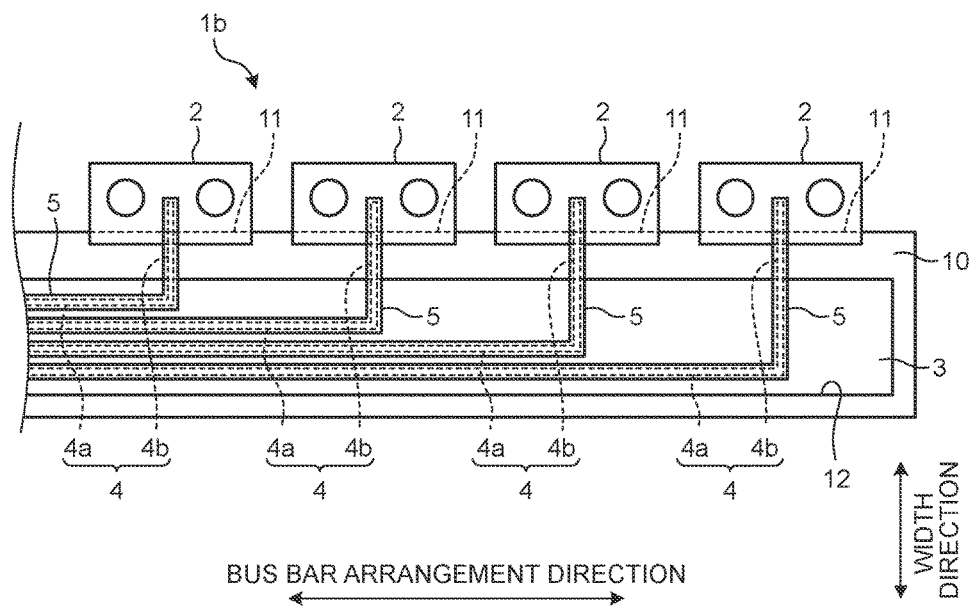
FIG. 10 is a plan view illustrating a schematic configuration of a printed circuit body according to a second embodiment of the present invention, and a schematic diagram for description of processing in step S204 in a flowchart illustrated in FIG. 14.
Figure 11:
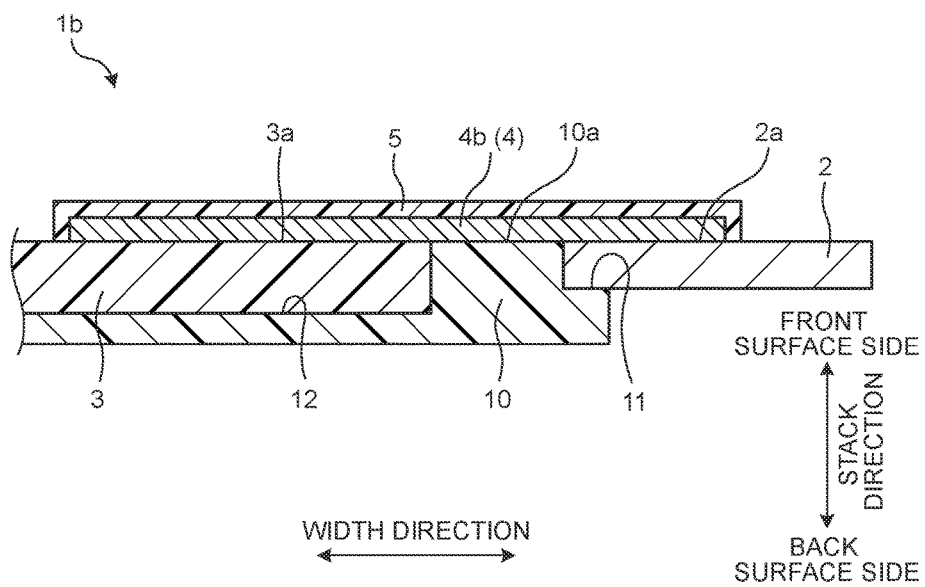
FIG. 11 is a cross-sectional view illustrating a sectional shape of the printed circuit body illustrated in FIG. 10, which is orthogonal to the bus bar arrangement direction.
Figure 12:
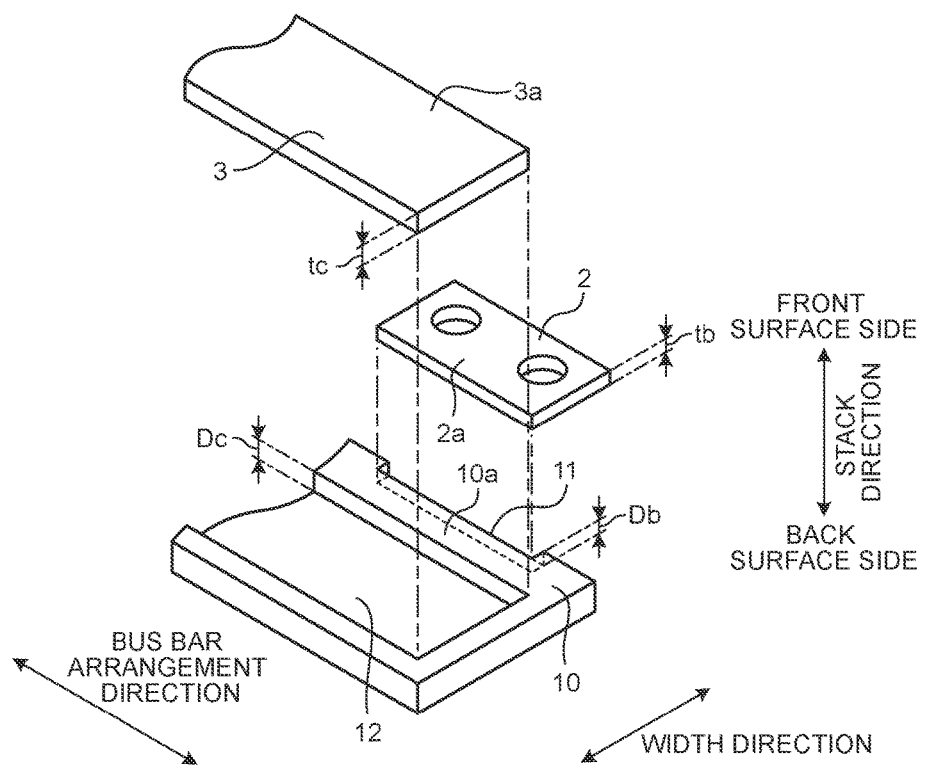
FIG. 12 is a partially exploded perspective view of the printed circuit body illustrated in FIG. 10.
Figure 13:
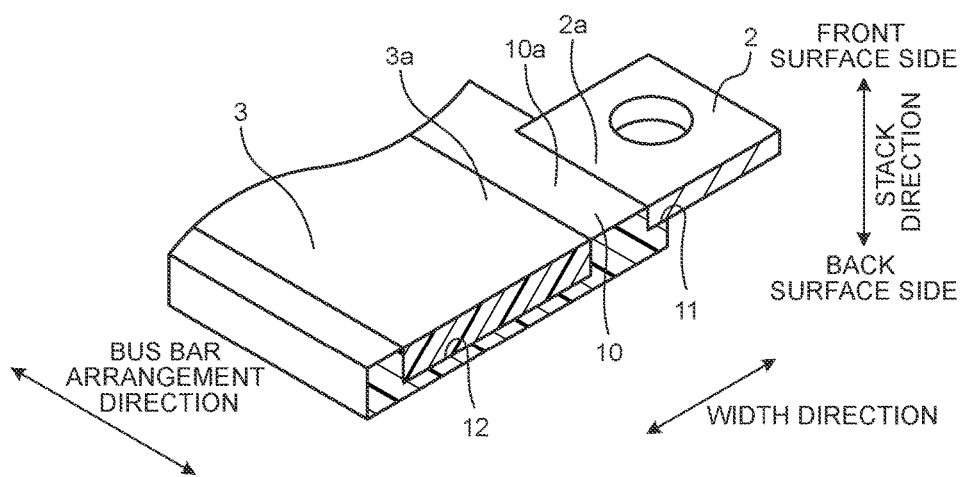
FIG. 13 is a partially sectional perspective view of the printed circuit body illustrated in FIG. 10.

The following describes a second embodiment with reference to FIGS. 10 to 16. The configuration of a printed circuit body 1b according to the second embodiment will be first described with reference to FIGS. 10 to 13. FIG. 10 is a plan view illustrating a schematic configuration of the printed circuit body according to the second embodiment of the present invention. FIG. 11 is a cross-sectional view illustrating a sectional shape of the printed circuit body illustrated in FIG. 10, which is orthogonal to the bus bar arrangement direction. FIG. 12 is a partially exploded perspective view of the printed circuit body illustrated in FIG. 10. FIG. 13 is a partially sectional perspective view of the printed circuit body illustrated in FIG. 10.

As illustrated in FIGS. 10 to 13, the printed circuit body 1b includes the bus bar 2, the insulator layer 3, the conductor layer 4, the resist layer 5, and a housing 10 (second insulator layer). The printed circuit body 1b according to the second embodiment has a configuration different from those of the printed circuit bodies 1 and 1a according to the first embodiment in that the bus bar 2 and the insulator layer 3 are integrated with each other with the housing 10 interposed therebetween, and the conductor layer 4 is also formed across the housing 10 interposed between the bus bar 2 and the insulator layer 3. In the following, any component similar to that in the above-described embodiment is denoted by a common reference sign, and duplicate description of any common configuration, operation or effect will be omitted as appropriate.

The housing 10 is a substrate having a surface on which the bus bar 2, the insulator layer 3, and the conductor layer 4 are disposed to couple the conductor layer 4 and the bus bar 2. The housing 10 is, for example, part of a housing member that houses various components of an instrument including a power supply device bus bar module (printed circuit body 1b). The housing 10 is formed of an insulating material same as that of the insulator layer 3. The material of the housing 10 may be identical to or different from the material of the insulator layer 3. As illustrated in FIGS. 10 to 13, the bus bar 2 and the insulator layer 3 are placed separately from each other on a principal surface of the housing 10 on the front surface side in the stack direction. Thus, in the printed circuit body 1b, the principal surface of the housing 10 is exposed between the bus bar 2 and the insulator layer 3. Accordingly, the conductor layer 4 is formed across the bus bar 2, the housing 10, and the insulator layer 3.

The bus bars 2 and the housing 10 are integrated with each other through one end of each bus bar 2 in the width direction at one end face of the housing 10 in the bus bar arrangement direction. When the insulator layer 3 and the housing 10 are integrated with each other, the insulator layer 3 and each bus bar 2 are disposed at an interval therebetween in the width direction. In the printed circuit body 1b according to the present embodiment, the bus bar 2, the insulator layer 3, and the housing 10 are integrated with each other so that the bus-bar side connected surface 2a of the bus bar 2, on which the conductor layer 4 is provided, the insulator-layer side connected surface 3a of the insulator layer 3 on which the conductor layer 4 is provided and a housing connection surface 10a (second insulator-layer side connected surface) of the housing 10 on which the conductor layer 4 is provided are positioned flush with each other at an identical plane.

More specifically, the housing 10 includes a first recess 11 formed in a depth equivalent to the thickness of the bus bar 2, and a second recess 12 formed in a depth equivalent to a thickness of the insulator layer 3.

The first part 11 is formed at an end part of the housing 10, facing each bus bar 2 in the width direction, in this example, at an end part in the bus bar arrangement direction. The first recess 11 is formed to extend in a range of the housing 10, in which the bus bar 2 is provided in the bus bar arrangement direction. The first recess 11 is formed as a substantially rectangular parallelepiped space having a substantially rectangular sectional shape orthogonal to the bus bar arrangement direction. The first recess 11 is formed so that a depth Db (refer to FIG. 12) in the stack direction is equivalent to a thickness tb (refer to FIG. 12) of the bus bar 2 in the stack direction. A plurality of, four in this case, first recesses 11 corresponding to the number of bus bars 2 are provided.

The second recess 12 is formed separately from each first recess 11 in the width direction in the housing 10. The second recess 12 is formed to extend in a range where the insulator layer 3 is provided in the bus bar arrangement direction in the housing 10. The second recess 12 is formed as a substantially rectangular parallelepiped space having a substantially rectangular sectional shape orthogonal to the bus bar arrangement direction. The second recess 12 is formed so that a depth Dc (refer to FIG. 12) in the stack direction is equivalent to a thickness tc (refer to FIG. 12) of the insulator layer 3 in the stack direction.

An end part of the bus bar 2 is housed in the first recess 11 and an end part of the insulator layer 3, in this example, the entire insulator layer 3 including the end part is housed in the second recess 12, whereby the bus-bar side connected surface 2a, the insulator-layer side connected surface 3a, and the housing connection surface 10a are positioned at an identical plane (refer to FIG. 13, for example). In other words, in the printed circuit body 1b according to the present embodiment, part of an end part of each bus bar 2 in the bus bar arrangement direction is housed in the first recess 11 formed in the housing 10 and the entire insulator layer 3 is housed in the second part 12 formed in the housing 10, whereby the bus-bar side connected surface 2a, the insulator-layer side connected surface 3a, and the housing connection surface 10a are positioned at an identical plane. In the printed circuit body 1b, each bus bar 2 and the housing 10 are integrated with each other at a contact part and the insulator layer 3 and the housing 10 are integrated with each other at a contact part, whereas part of an end part of each bus bar 2 in the bus bar arrangement direction is housed in the first recess 11 formed in the housing 10 and the entire insulator layer 3 is housed in the second recess 12 formed in the housing 10.

Figure 14:
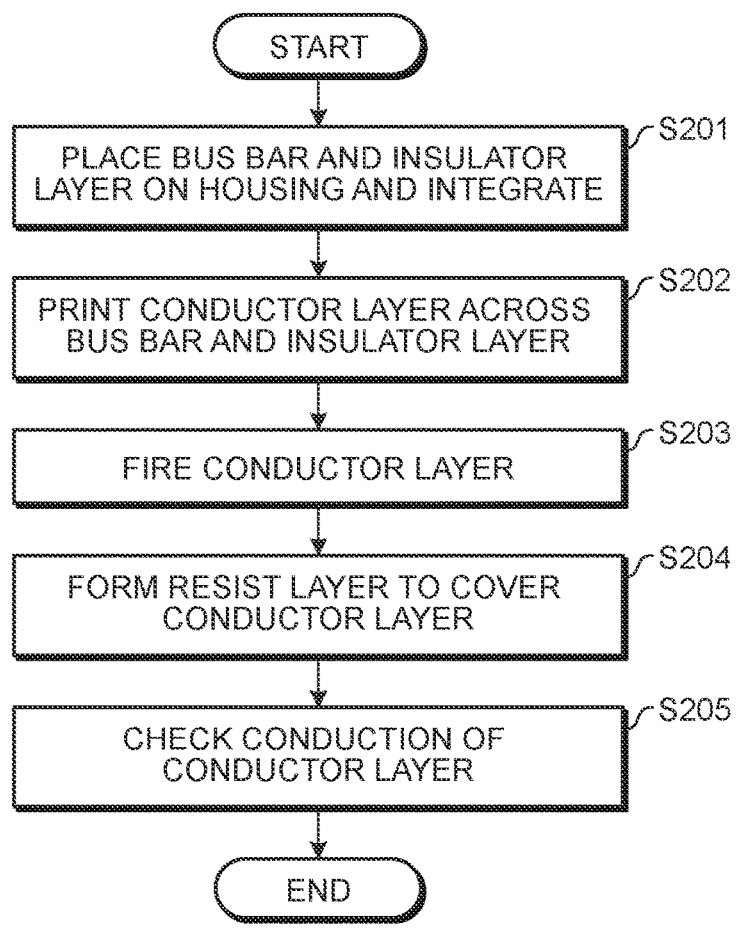
FIG. 14 is a flowchart illustrating a process of manufacturing the printed circuit body according to the second embodiment.
Figure 15:
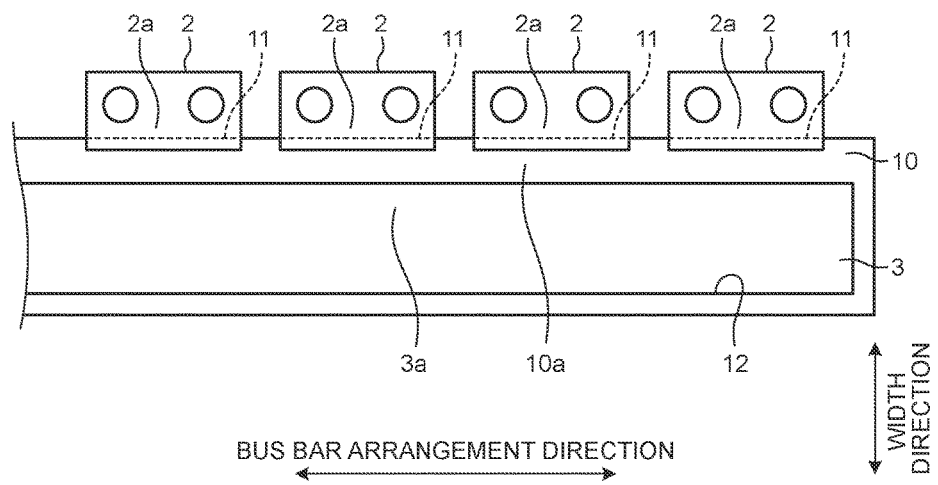
FIG. 15 is a schematic diagram for description of processing in step S201 in the flowchart illustrated in FIG. 14.
Figure 16:
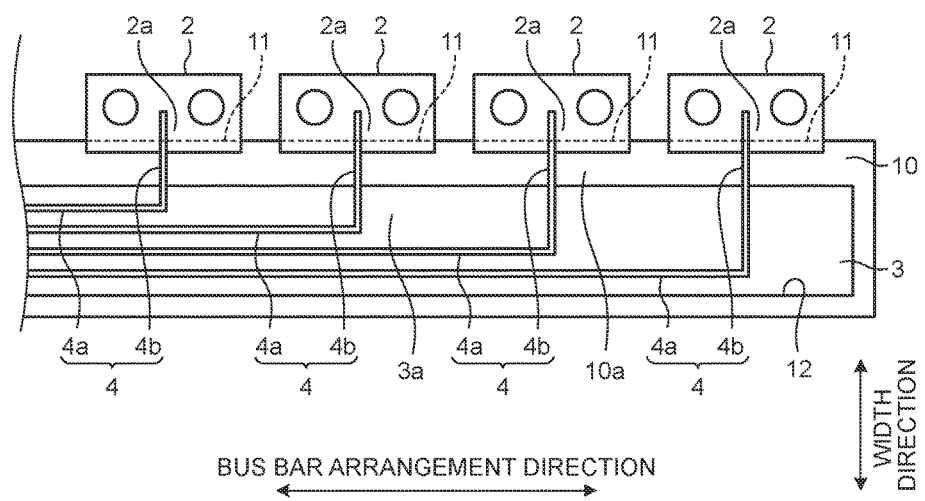
FIG. 16 is a schematic diagram for description of processing in step S202 in the flowchart illustrated in FIG. 14.

The following describes a process of manufacturing the printed circuit body 1b according to the second embodiment with reference to FIGS. 14 to 16. FIG. 14 is a flowchart illustrating the process of manufacturing the printed circuit body according to the second embodiment. FIG. 15 is a schematic diagram for description of processing in step S201 in the flowchart illustrated in FIG. 14. FIG. 16 is a schematic diagram for description of processing at step S202 in the flowchart illustrated in FIG. 14. FIG. 10 described above is a schematic diagram for description of processing in step S204 in the flowchart illustrated in FIG. 14, and thus is referred to in the following. The following describes the process of manufacturing the printed circuit body 1b in accordance with the flowchart illustrated in FIG. 14 with reference to FIGS. 10, 11, 12, 13, 15, and 16.

In step S201, the bus bar 2 and the insulator layer 3 are placed on the housing 10 and integrated with each other. In this example, a plurality of (four, in FIG. 15) bus bars 2 is placed in parallel to each other in the bus bar arrangement direction on the principal surface of the housing 10 on the front surface side in the stack direction, and each bus bar 2, the insulator layer 3, and the housing 10 are integrated with each other by, for example, thermal welding so that the bus-bar side connected surface 2a, the insulator-layer side connected surface 3a, and the housing connection surface 10a are positioned at an identical plane in a positional relation in which part of an end part of each bus bar 2 is housed in the corresponding first recess 11 and the entire insulator layer 3 is housed in the second part 12. When each bus bar 2, the insulator layer 3, and the housing 10 are integrated with each other, as illustrated in FIG. 15, the insulator layer 3 has a strip shape extending in the bus bar arrangement direction at a predetermined distance from the bus bars 2 in the width direction on the principal surface of the housing 10 on the front surface side in the stack direction, and is integrated with part of each bus bar 2 at one end face of the housing 10, which extends in the bus bar arrangement direction. In this process, the bus bar 2 and the insulator layer 3 may be integrated onto the housing 10 by bonding through an adhesive agent, or may be integrated with the housing 10 by fastening through, for example, a screw. Having completed the processing in step S201, the process proceeds to step S202.

In step S202, the conductor layer 4 is formed across the bus-bar side connected surface 2a of the bus bar 2 and the insulator-layer side connected surface 3a of the insulator layer 3 by printing. More specifically, the conductor layer 4 is formed across the bus-bar side connected surface 2a, the housing connection surface 10a, and the insulator-layer side connected surface 3a by printing while the housing connection surface 10a of the housing 10 is interposed between the bus-bar side connected surface 2a and the insulator-layer side connected surface 3a. The conductor layers 4 of the same number (four, in FIG. 16) as the number of bus bars 2 are formed. Each conductor layer 4 is individually connected with any one of the bus bars 2. As illustrated in FIG. 16, in each conductor layer 4, the main line part 4a is formed in a linear shape extending the insulator layer 3 in the bus bar arrangement direction, and the connection line part 4b is formed in a linear shape extending from the main line part 4a to any one of the bus bars 2 in the width direction substantially orthogonal to a direction where the main line part 4a extends. The connection line part 4b of the conductor layer 4 is formed across the insulator-layer side connected surface 3a of the insulator layer 3, the housing connection surface 10a of the housing 10, and the bus-bar side connected surface 2a of the bus bar 2 in the width direction. In this process, the conductor layer 4 is disposed, in an overlapping manner, on the bus-bar side connected surface 2a of the bus bar 2, the housing connection surface 10a of the housing 10, and the insulator-layer side connected surface 3a of the insulator layer 3 on the front surface side in the stack direction, for example, by printing conductive paste (Ag paste RA FS 074 manufactured by TOYOCHEM CO., LTD) using a dispenser (high-performance screw dispenser SCREW MASTER2 manufactured by Musashi Engineering, Inc.). Having completed the processing in step S202, the process proceeds to step S203.

In step S203, the conductor layer 4 is fired. This firing processing provides conduction to the conductor layer 4. In this process, a heated-air dryer is used to perform drying, for example, at 150° C. for 30 minutes. Having completed the processing in step S203, the process proceeds to step S204.

In step S204, the resist layer 5 is formed to cover the conductor layer 4. The resist layers 5 of the same number (four, in the present embodiment) as the number of bus bars 2 and the number of conductor layers 4 are formed. Each resist layer 5 is formed on the front surface side in the stack direction to cover the entire range of any one of the conductor layers 4. In other words, as illustrated in FIG. 10, each resist layer 5 is formed in a linear shape extending in the bus bar arrangement direction to cover the main line part 4a of the conductor layer 4 and is formed in a linear shape extending in the width direction to cover the connection line part 4b of the conductor layer 4. Having completed the processing in step S204, the process proceeds to step S205.

In step S205, conduction evaluation is performed to check conduction of the conductor layer 4. In the conduction evaluation, a conduction test using a tester is performed on the conductor layer 4 to check conduction between one end part of the conductor layer 4, which is closer to the bus bar 2, and the other end part closer to the insulator layer 3. Upon completion of processing at step S205, the process of manufacturing the printed circuit body 1b ends.

The following describes advantageous effects of the printed circuit body 1b according to the second embodiment.

Similarly to the printed circuit body 1 according to the first embodiment, the printed circuit body 1b according to the second embodiment includes the bus bar 2 electrically connected with a connected body such as a terminal of a battery, the insulator layer 3 providing insulation, and the conductor layer 4 formed across the bus bar 2 and the insulator layer 3 and electrically connected with the bus bar 2, and the bus-bar side connected surface 2a of the bus bar 2, on which the conductor layer 4 is provided, and the insulator-layer side connected surface 3a of the insulator layer 3, on which the conductor layer 4 is provided, are positioned at an identical plane. The printed circuit body 1b further includes the resist layer 5 covering and protecting the conductor layer 4. The conductor layer 4 is formed by printing conductive paste and then firing the conductive paste to provide conduction. Thus, the printed circuit body 1b according to the second embodiment can achieve an effect same as that of the printed circuit body 1 according to the first embodiment.

The printed circuit body 1b according to the second embodiment further includes the housing 10 on which the bus bar 2 and the insulator layer 3 are placed separately from each other. The conductor layer 4 is formed across the bus bar 2, the housing 10, and the insulator layer 3. The bus-bar side connected surface 2a of the bus bar 2, the insulator-layer side connected surface 3a of the insulator layer 3, and the housing connection surface 10a of the housing 10, on which the conductor layer 4 is provided in the housing 10, are positioned at an identical plane. In the printed circuit body 1b with this configuration, the bus bar 2 and the insulator layer 3 are disposed on the housing 10, which makes it easy to fix relative positions of the bus bar 2 and the insulator layer 3 and thus form the conductor layer 4 between the bus bar 2 and the insulator layer 3, thereby achieving improved workability. In this case, in the printed circuit body 1b, the bus-bar side connected surface 2a of the bus bar 2, the insulator-layer side connected surface 3a of the insulator layer 3, and the housing connection surface 10a of the housing 10, on which the conductor layer 4 is provided, are positioned flush with each other at an identical plane, which makes it possible to easily and accurately provide the conductor layer 4 across the bus-bar side connected surface 2a, the housing connection surface 10a, and the insulator-layer side connected surface 3a. In addition, in the printed circuit body 1b, the bus-bar side connected surface 2a of the bus bar 2, the insulator-layer side connected surface 3a of the insulator layer 3, and the housing connection surface 10a of the housing 10, on which the conductor layer 4 is provided, are positioned flush with each other at an identical plane, which makes it easy to accurately print the conductor layer 4 as a printed body across the bus-bar side connected surface 2a, the insulator-layer side connected surface 3a, and the housing connection surface 10a and to substantially uniformly print the thickness of the conductor layer 4 over the bus-bar side connected surface 2a, the insulator-layer side connected surface 3a, and the housing connection surface 10a, thereby easily achieving a stable conductor resistance.

In the printed circuit body 1b according to the second embodiment, the housing 10 includes the first recess 11 formed in the depth Db equivalent to the thickness tb of the bus bar 2, and the second recess 12 formed in the depth Dc equivalent to the thickness tc of the insulator layer 3. An end part of the bus bar 2 is housed in the first recess 11, and an end part of the insulator layer 3, in this example, the entire insulator layer 3 including the end part is housed in the second recess 12, whereby the bus-bar side connected surface 2a, the insulator-layer side connected surface 3a, and the housing connection surface 10a are positioned at an identical plane. With this simple configuration, the printed circuit body 1b can fix relative positions of the bus bar 2, the insulator layer 3, and the housing 10, and achieve the configuration in which the bus-bar side connected surface 2a and the insulator-layer side connected surface 3a, and the housing connection surface 10a, on which the conductor layer 4 is provided, are positioned at an identical plane.

In the printed circuit body 1b according to the second embodiment, the housing 10 and the insulator layer 3 may be collectively formed as a single member. In other words, the insulator layer 3 may be removed from the printed circuit body 1b according to the second embodiment so that the conductor layer 4 is directly formed on the housing 10. In this case, the housing 10 serves as an insulator layer on which the main line part 4a of the conductor layer 4 is disposed. The connection line part 4b of the conductor layer 4 is formed across the housing 10 and the bus bar 2 in the width direction.

When the bus-bar side connected surface 2a, the insulator-layer side connected surface 3a, and the housing connection surface 10a are positioned at an identical plane as described above, manufacturing error or the like is allowed, and typically, the positioning at an identical plane only needs to allow the conductor layer 4 as a printed body to be appropriately printed across the bus-bar side connected surface 2a, the insulator-layer side connected surface 3a, and the housing connection surface 10a.

The embodiments of the present invention are described above, but the above-described embodiments are presented as examples and not intended to limit the scope of the present invention. The above-described embodiments may be achieved in other various configurations, and various kinds of omission, replacement, and change are possible without departing from the gist of the invention. The above-described embodiments and modifications are included in the scope and gist of the invention and also included in the invention recited in the claims and equivalents thereof.

Although the above embodiments exemplarily describe the configurations in which the printed circuit bodies 1, 1a, and 1b according to the embodiments are each applied as a power supply device bus bar module, the printed circuit bodies 1, 1a, and 1b are applicable to a device other than a bus bar module.

Each bus bar 2 may be any metal member that electrically connects a connected body (for example, a terminal of a battery) and the conductor layer 4, may have a shape other than a rectangular plate, and may be replaced with an component having a function other than a function of the bus bar 2 (terminal).

Although the above embodiments exemplarily describe the configuration in which the resist layer 5 is provided as a component protecting the conductor layer 4, no resist layer 5 may be provided to protect the conductor layer 4 in accordance with, for example, use environment of the printed circuit bodies 1, 1a, and 1b according to the embodiments.

Although the above embodiments exemplarily describe the configuration in which the resist layer 5 is provided as a component protecting the conductor layer 4, an insulation cover that covers the bus bar 2 and the entire insulator layer 3 may be employed in place of the resist layer 5. The insulation cover preferably have, for example, adhesive PET, PEN, PC, PP, PBT, or PU applied on one surface thereof that contacts with the insulator layer 3.

In the above-described embodiments, the conductor layer 4 is formed by printing, but may be formed by any other method by which the conductor layer 4 is formed across the bus bar 2 and the insulator layer 3 and by which the main line part 4a and the connection line part 4b are integrally formed.

A printed circuit body according to the present embodiment can simultaneously achieve connection between a metal member and a conductor layer and circuit formation to easily form a wiring structure of the metal member and the conductor layer.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A printed circuit body comprising:
a metal member electrically connected with a connected body;
an insulator layer providing insulation properties; and
a conductor layer formed across the metal member and the insulator layer and electrically connected with the metal member, wherein
the metal member and the insulator layer are positioned such that a metal-member side connected surface of the metal member on which the conductor layer is provided and an insulator-layer side connected surface of the insulator layer on which the conductor layer is provided are positioned at an identical plane, wherein
the metal member includes a recess formed in a depth equivalent to a thickness of the insulator layer, and the metal-member side connected surface and the insulator-layer side connected surface are positioned at an identical plane with an end part of the insulator layer being housed in the recess.

2. The printed circuit body according to claim 1, further comprising:
a second insulator layer on which the metal member and the insulator layer are placed separately from each other, wherein
the conductor layer is formed across the metal member, the second insulator layer, and the insulator layer, and
the metal member, the insulator layer, and the second insulator layer are positioned such that the metal-member side connected surface, the insulator-layer side connected surface, and a second insulator-layer side connected surface of the second insulator layer on which the conductor layer is provided are positioned at an identical plane.

3. The printed circuit body according to claim 2, wherein
the second insulator layer includes a first recess formed in a depth equivalent to a thickness of the metal member and a second recess formed in a depth equivalent to a thickness of the insulator layer, and
the metal-member side connected surface, the insulator-layer side connected surface, and the second insulator-layer side connected surface are positioned at an identical plane with an end part of the metal member being housed in the first recess and an end part of the insulator layer being housed in the second recess.

4. The printed circuit body according to claim 3, further comprising:
a protection layer covering and protecting the conductor layer.

5. The printed circuit body according to claim 3, wherein the conductor layer is a printed body formed by printing.

6. The printed circuit body according to claim 2, further comprising:
a protection layer covering and protecting the conductor layer.

7. The printed circuit body according to claim 2, wherein the conductor layer is a printed body formed by printing.

8. The printed circuit body according to claim 1, further comprising:
a protection layer covering and protecting the conductor layer.

9. The printed circuit body according to claim 8, wherein the conductor layer is a printed body formed by printing.

10. The printed circuit body according to claim 1, wherein the conductor layer is a printed body formed by printing.

11. The printed circuit body according to claim 10, wherein
the conductor layer is the printed body formed by printing conductive paste and then performing firing to provide conduction, and
the conductive paste is any one of Ag paste, Cu paste, and Au paste, metal primary components of which are silver (Ag), copper (Cu), and gold (Au), respectively, or a mixture of two or more of these pastes.

12. The printed circuit body according to claim 1, wherein the recess is formed at an end part of the metal member, facing the insulator layer in a width direction.

13. The printed circuit body according to claim 12, wherein the recess is formed to extend from one end part of the metal member to the other end part in the width direction.

14. The printed circuit body according to claim 12, wherein the recess is formed as a substantially rectangular parallelepiped space having a substantially rectangular sectional shape orthogonal to the width direction.

15. The printed circuit body according to claim 1, wherein the conductor layer is formed in a linear shape, and includes a main line part extending on the insulator layer in a width direction, and a connection line part extending from the main line part to the metal member in a direction which is substantially orthogonal to a direction in which the main line part extends.

* * * * *